(12) United States Patent
Mao et al.

(10) Patent No.: US 11,374,102 B2
(45) Date of Patent: Jun. 28, 2022

(54) FINFET AND A MANUFACTURING METHOD OF A CONTACT THEREOF

(71) Applicant: Shanghai Huali Integrated Circuit Mfg. Co., Ltd., Shanghai (CN)

(72) Inventors: Yongji Mao, Shanghai (CN); Ronghong Ye, Shanghai (CN); Liyao Liu, Shanghai (CN); Yu Zhang, Shanghai (CN); Zhanyuan Hu, Shanghai (CN)

(73) Assignee: SHANGHAI HUALI INTEGRATED CIRCUIT MFG. CO., LTD., Shanghai (CN)

(*) Notice: Subject to any disclaimer, the term of this patent is extended or adjusted under 35 U.S.C. 154(b) by 0 days.

(21) Appl. No.: 17/096,972

(22) Filed: Nov. 13, 2020

(65) Prior Publication Data
US 2021/0305383 A1 Sep. 30, 2021

(30) Foreign Application Priority Data
Mar. 30, 2020 (CN) .......................... 202010236487.9

(51) Int. Cl.
| | | |
|---|---|---|
| *H01L 21/311* | (2006.01) | |
| *H01L 21/8238* | (2006.01) | |
| *H01L 29/78* | (2006.01) | |
| *H01L 29/417* | (2006.01) | |
| *H01L 21/285* | (2006.01) | |
| *H01L 29/66* | (2006.01) | |

(52) U.S. Cl.
CPC .. *H01L 29/41791* (2013.01); *H01L 21/28512* (2013.01); *H01L 21/31111* (2013.01); *H01L 21/31144* (2013.01); *H01L 29/66795* (2013.01); *H01L 29/7851* (2013.01)

(58) Field of Classification Search
CPC ............ H01L 21/0337; H01L 21/3086; H01K 2203/0554
See application file for complete search history.

(56) References Cited

U.S. PATENT DOCUMENTS 10,867,842 B2* 12/2020 Wang ................... H01L 27/0886
2017/0047290 A1* 2/2017 Singh ................ H01L 21/76811

* cited by examiner

*Primary Examiner* — Fernando L Toledo
*Assistant Examiner* — Valerie N Newton
(74) *Attorney, Agent, or Firm* — Adsero IP

(57) ABSTRACT

The present disclosure relates to a FinFET and a manufacturing method of a contact. The manufacturing method comprises steps of: sequentially generating an interlayer dielectric layer, a metal hard mask, an oxide protective cap and a tri-layer mask on a gate to form a device to be etched; photoetching the tri-layer mask to remove photoresist in a non-patterned area; performing main etch on the device to be etched after the photoetching to remove the interlayer dielectric layer in the area that is not covered by the metal hard mask, and the metal hard mask is provided with the oxide protective cap; performing ODL removal on the device to be etched after the main etch to remove remaining part of the tri-layer mask; performing oxide etch on the device to be etched after the ODL removal to remove the oxide protective cap; and generating the contact on the device after the oxide etch. The present disclosure can accurately control the critical dimensions of the contact in an X direction and a Y direction.

14 Claims, 8 Drawing Sheets

LWR: 3.3

FINFET AND A MANUFACTURING METHOD OF A CONTACT THEREOF

CROSS-REFERENCES TO RELATED APPLICATIONS

The present application claims priority to Chinese Patent Application No. 202010236487.9, filed on Mar. 30, 2020, the content of which is incorporated herein by reference in its entirety.

FIELD

The present disclosure relates to the field of integrated circuit technology, and specifically discloses a fin field-effect transistor (FinFET) with a contact with a non-rounded titanium nitride (TiN) profile, and a manufacturing method of the contact with the non-rounded titanium nitride profile.

BACKGROUND

FinFET is a new complementary metal-oxide-semiconductor transistor, which is named because the shape of the transistor is similar to that of a fish fin. By adopting the fin-shaped design, circuit control can be improved, leakage current of the transistor can be reduced, and gate length of the transistor can be shortened.

In 14 nm FinFET, contact process change to metal hard mask and self-alignment technology—Cut Metal Dielectric (CMD), M0A and M0P, which is tough process control but better manufacture capability CT2PO (contact to polysilicon) short window.

Presently, M0A (contact between wire M1 and active area AA) dry etching is hard to achieve well X direction and Y direction critical dimensions (CD) loading. In particular, the Y direction CD variation is high due to top rounding by excessive consumption of TiN, which leads to problems such as divergent line widths and bad line width roughness (LWR) of semiconductor devices.

Referring to FIG. 1A and FIG. 1B, FIG. 1A shows a schematic cross-sectional view in the Y direction of a vertical contact M0A manufactured by existing dry etching process, and FIG. 1B shows a schematic diagram of line width roughness of the vertical contact M0A manufactured by existing dry etching process.

As shown in FIG. 1A, the vertical contact M0A manufactured by existing dry etching process has obvious top rounding in the Y direction. In some embodiments, the rounded corner angle of the rounding can reach 78°. It is understandable that the rounding phenomenon is an uncontrollable result caused by steps such as organic dielectric layer (ODL) removal. Therefore, the vertical contact M0A manufactured by existing dry etching process generally has problems such as bad line width roughness. As shown in FIG. 1B, in some embodiments, line width roughness of the vertical contact M0A manufactured by existing dry etching process may reach 5.9, which may adversely affect the performance and reliability of the FinFET.

In order to overcome the above-mentioned shortcomings in the prior art, there is an urgent need in the art for a FinFET manufacturing technology for accurately controlling the critical dimensions of the vertical contact M0A in X and Y directions, improving the performance of the vertical contact M0A and improving the reliability of the FinFET manufacturing process.

SUMMARY

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to overcome the above-mentioned defects in the prior art, the present disclosure provides a fin field-effect transistor (FinFET) with a contact with a non-rounded titanium (TiN) nitride profile, and a manufacturing method of the contact with the non-rounded titanium nitride profile, for accurately controlling the critical dimensions of the vertical contact M0A in X and Y directions, improving the performance of the vertical contact M0A and improving the reliability of the FinFET manufacturing process.

The manufacturing method of a contact of a FinFET provided by the present disclosure comprises steps: sequentially generating an interlayer dielectric layer, a metal hard mask, an oxide protective cap and a tri-layer mask on a gate to form a device to be etched; photoetching the tri-layer mask to remove photoresist in a non-patterned area; performing main etch on the device to be etched after photoetching to remove the interlayer dielectric layer in the area neither covered by the photoresist nor covered by the metal hard mask, and the metal hard mask is provided with the oxide protective cap;

performing ODL removal on the device to be etched after the main etch to remove remaining part of the tri-layer mask; performing oxide etch on the device to be etched after the ODL removal to remove the oxide protective cap; and generating the contact on the device after the oxide etch.

In one embodiment, in some embodiments of the present disclosure, the tri-layer mask may comprise a photoresist layer, an intermediate layer and a lower layer, and the photoresist layer may comprise a pattern area for defining a critical dimension of the contact in an X direction.

In some embodiments of the present disclosure, a step may be further comprised: performing ODL etch before the main etch step, removing the tri-layer mask in the non-patterned area to expose the interlayer dielectric layer underneath.

In one embodiment, in some embodiments of the present disclosure, the metal hard mask may comprise a pattern area for defining a critical dimension of the contact in a Y direction. The oxide protective cap may cover the metal hard mask to avoid damage to the metal hard mask in the ODL removal step.

In some embodiments of the present disclosure, the step of generating the metal hard mask and the oxide protective cap may comprise: depositing a metal hard mask layer, an oxide protective layer and another set of tri-layer mask on the interlayer dielectric layer to form a device to be generated; photoetching the another set of tri-layer mask, removing photoresist in non-patterned area to define a critical dimension of the metal hard mask in the Y direction; and performing CMD etch on the device to be generated after photoetching to obtain the metal hard mask and the oxide protective cap comprising the pattern area.

In one embodiment, in some embodiments of the present disclosure, the main etch step may further comprise: retaining the oxide protective cap and part of oxide layer above active area when removing the interlayer dielectric layer.

In some embodiments of the present disclosure, the step of retaining the oxide protective cap and part oxide layer above active area may further comprise: ensuring that height of the oxide protective cap is between 50 angstroms and 100 angstroms; and ensuring that height of the part of oxide layer is between 50 angstroms and 100 angstroms.

In one embodiment, in some embodiments of the present disclosure, the oxide etch step may further comprise: removing the part of oxide layer retained above the active area.

In one embodiment, in some embodiments of the present disclosure, the step of generating the contact may comprise: leading out active area to wire layer in vertical direction with a conductive material.

According to another aspect of the present disclosure, a FinFET is also provided herein.

The FinFET provided by the present disclosure may comprise the contact provided in any one of the above-mentioned embodiments. The contact has a non-rounded TiN profile, which can have better contact performance and reliability.

BRIEF DESCRIPTION OF THE DRAWINGS

The above features and advantages of the present disclosure will be better understood after reading the detailed description of the embodiments of the present disclosure in conjunction with the following figures. In the figures, components are not necessarily drawn to scale, and components having similar related features may have the same or similar reference numerals.

REFERENCE SIGNS

20 FinFET;
21 active area;
22 polysilicon
23 fin;
24 metal hard mask;
M0A, M0P vertical contact;
V0, M0 contact;
M1 wire;
40 device to be etched;
41 gate layer;
421,422 interlayer dielectric layer;
43 metal hard mask;
44 oxide protective cap;
451~453 tri-layer mask;
50 device to be generated;
53 metal hard mask layer;
54 oxide protective layer;
551·553 tri-layer mask;
56 photoresist.

DETAILED DESCRIPTION OF EMBODIMENTS

The embodiments of the present disclosure are described in the following detailed description. Although the description of the present disclosure will be described in conjunction with the embodiments, this is not a limitation of the present disclosure. On the contrary, the disclosure is described in connection with the embodiments to cover other alternatives or modifications that are possible in the embodiments of the present disclosure. In order to provide a thorough understanding of the present disclosure, many specific details are included in the following description. The present disclosure may also be practiced without these details. In addition, some specific details are omitted in the description in order to avoid confusing or obscuring the present disclosure.

In the description of the present disclosure, it should be noted that the terms "installation", "connecting", and "connected" should be understood broadly unless explicitly stated and defined otherwise. For example, the terms "installation", "connecting", and "connected" may be either a fixed connection, a detachable connection, or an integral connection; the terms may be either a mechanical connection or an electrical connection; the terms also may be either a direct connection, an indirect connection through an intermediate medium, or an internal connection between two components.

In addition, "up", "down", "left", "right", "top", "bottom", "horizontal", "vertical" used in the following description shall be understood as the orientation described in the paragraph and shown in the related figure. The relative term is used for convenience of description only, and does not mean that the device described therein is to be manufactured or operated in the specific orientation, and therefore should not be construed as limiting the present disclosure.

Understandably, although the terms "first", "second", "third", etc. may be used to describe various components, regions, layers and/or portions to distinguish different components, regions, layers and/or portions, the order of these components, regions, layers and/or portions described above should not be limited by the terms. Therefore, a first component, region, layer and/or portion mentioned below may be also mentioned as a second component, region, layer and/or portion without departing from some embodiments of the present disclosure.

Figure 1A:
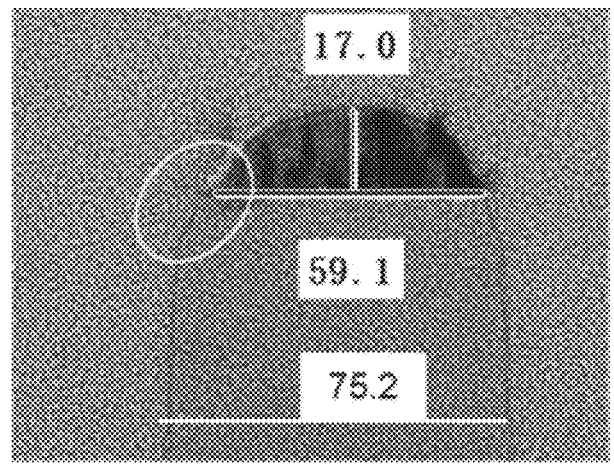
FIG. 1A shows a schematic cross-sectional view in the Y direction of a vertical contact M0A manufactured by existing dry etching process.
Figure 1B:
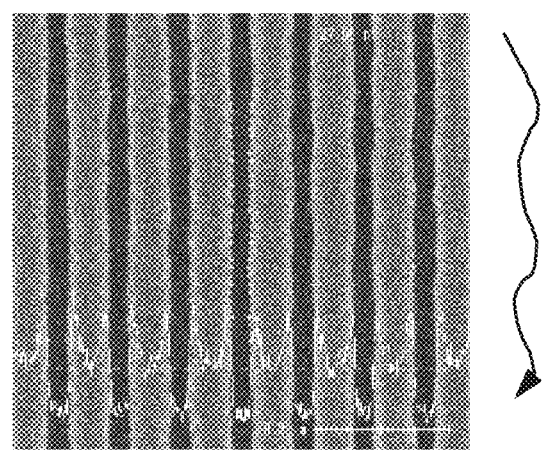
FIG. 1B shows a schematic diagram of line width roughness of the vertical contact M0A manufactured by existing dry etching process.
Figure 2:
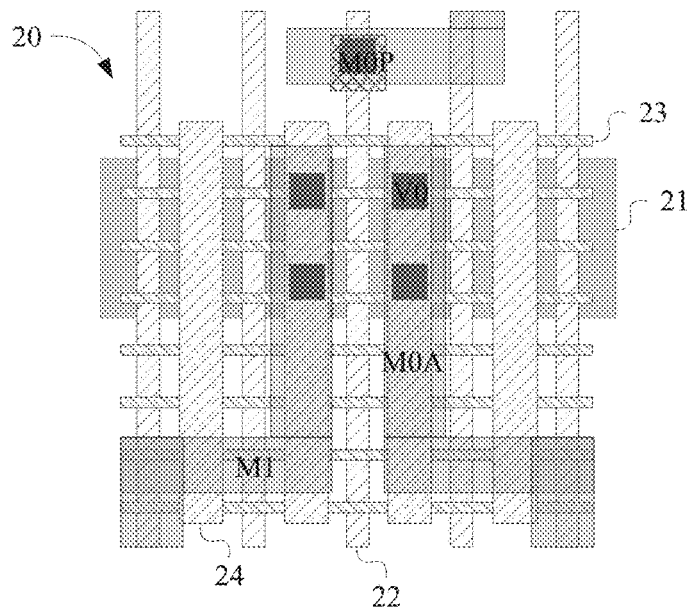
FIG. 2 shows a schematic top view of a FinFET according to some embodiments of the present disclosure.

Referring to FIG. 2, FIG. 2 shows a schematic top view of a fin field-effect transistor (FinFET) according to some embodiments of the present disclosure.

As shown in FIG. 2, in some embodiments of the present disclosure, the FinFET 20 may have a multi-layer structure, from bottom to top comprising an active area (AA) 21, polysilicon 22, fins 23, metal hard masks 24 and a wire layer. In some embodiments, the vertical contact M0A may connect the active area 21 and wire M1 in the wire layer in vertical direction, leading out the active area 21 and the polysilicon 22.

Figure 3:
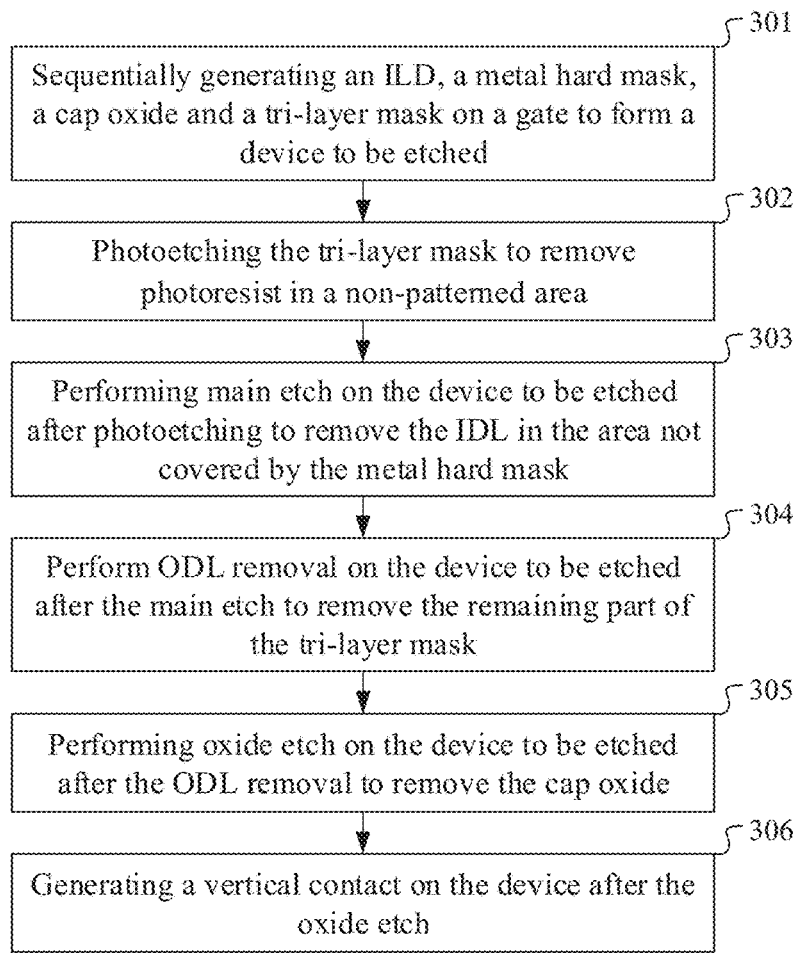
FIG. 3 shows a process diagram of manufacturing a contact of a FinFET according to some embodiments of the present disclosure.

The manufacturing process of the vertical contact M0A of the FinFET will be described below in conjunction with etching operations in the X direction and the Y direction. Referring to FIG. 3, FIG. 3 shows a process diagram of manufacturing a contact of a FinFET according to some embodiments of the present disclosure.

As shown in FIG. 3, the manufacturing method of the contact of the FinFET provided by the present disclosure may comprise the step:

301: sequentially generating an interlayer dielectric (ILD), a metal hard mask, an oxide protective cap (Cap Oxide) and a tri-layer mask on a gate to form a device to be etched.

The above-mentioned gate may be generated above each active area 21 and connected to adjacent active areas 21 to form a field effect transistor (FET) structure. In some embodiments, the FinFET 20 may comprise a plurality of gates for connecting a plurality of active areas 21. The outermost side of each gate may be covered with an oxide layer to provide insulation and protection to internal gate structure. An oxide can be filled between each two gates, to form a flat gate layer together with the gates.

Figure 4:
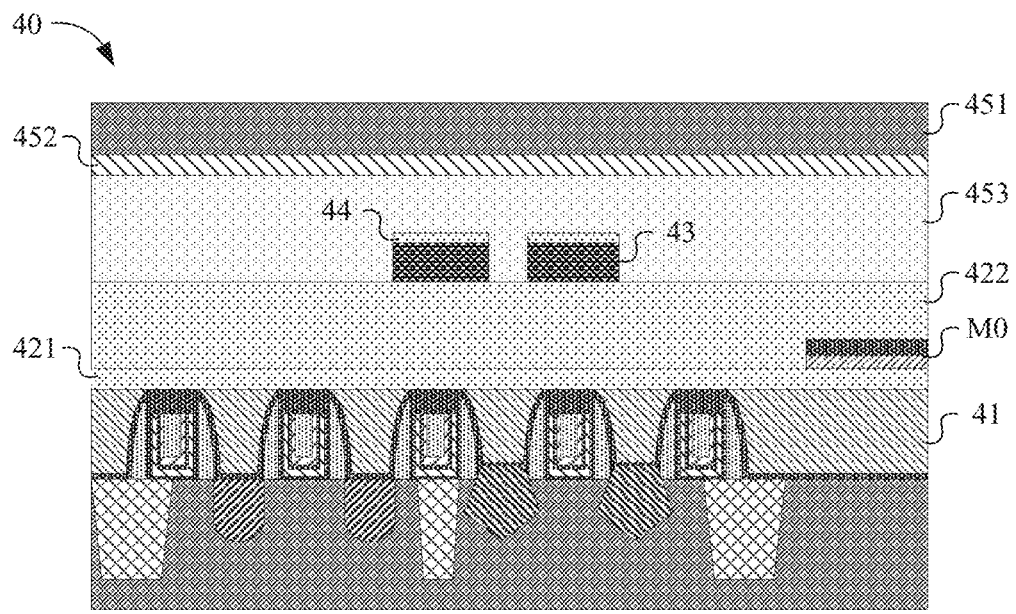
FIG. 4 shows a schematic structural diagram of a device to be etched according to some embodiments of the present disclosure.

Referring to FIG. 4, FIG. 4 shows a schematic structural diagram of a device to be etched according to some embodiments of the present disclosure.

As shown in FIG. 4, in some embodiments of the present disclosure, when generating a device 40 to be etched, an oxide layer 421 with a height of 100 angstroms (Å) may be deposited on the gate layer 41 first, and then a contact M0 may be implanted. After that, an oxide 422 with a height of 600 Å may be deposited on the oxide layer 421 to form an interlayer dielectric layer. In some embodiments, the oxide layer 421 may be TEOS OX. In some embodiments, the contact M0 may comprise titanium nitride (TiN) with a height of 50 Å and silicon nitride (SiN) with a height of 100 Å.

Then, a metal hard mask 43 with a cap oxide 44 may be generated on the interlayer dielectric layer 422. In some embodiments, the metal hard mask 43 may comprise a pattern area for defining a critical dimension (CD) of the contact M0A in the Y direction. In some embodiments, the cap oxide 44 may completely cover the metal hard mask 43 to avoid damage to the metal hard mask 43 in subsequent organic dielectric layer (ODL) removal step.

Figure 5A:
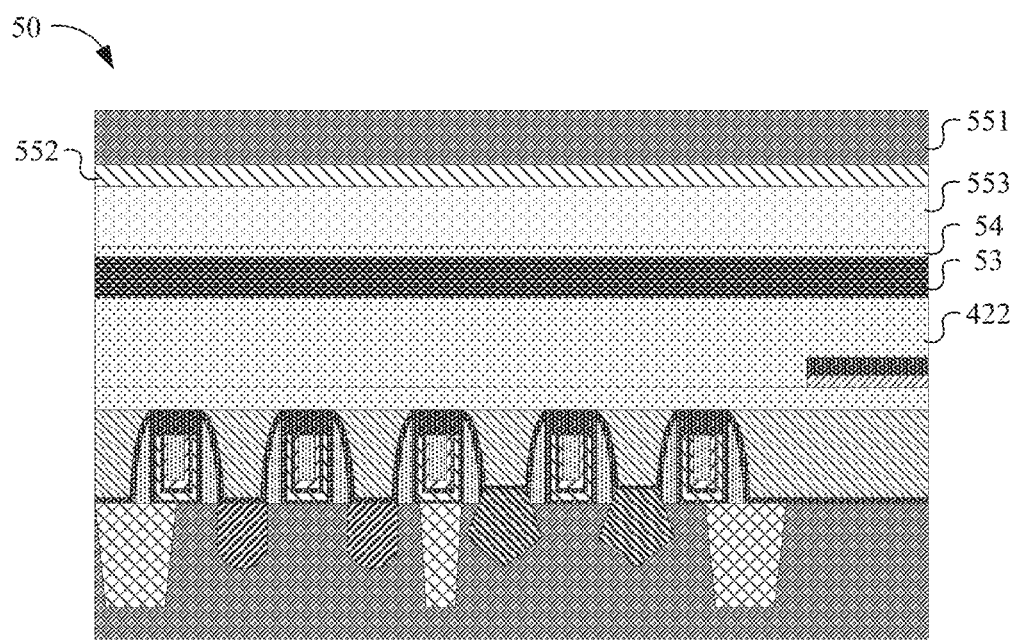
FIGS. 5A-5C show schematic structural diagrams of a device to be generated after each step of generating a device to be etched according to some embodiments of the present disclosure.
Figure 5B:
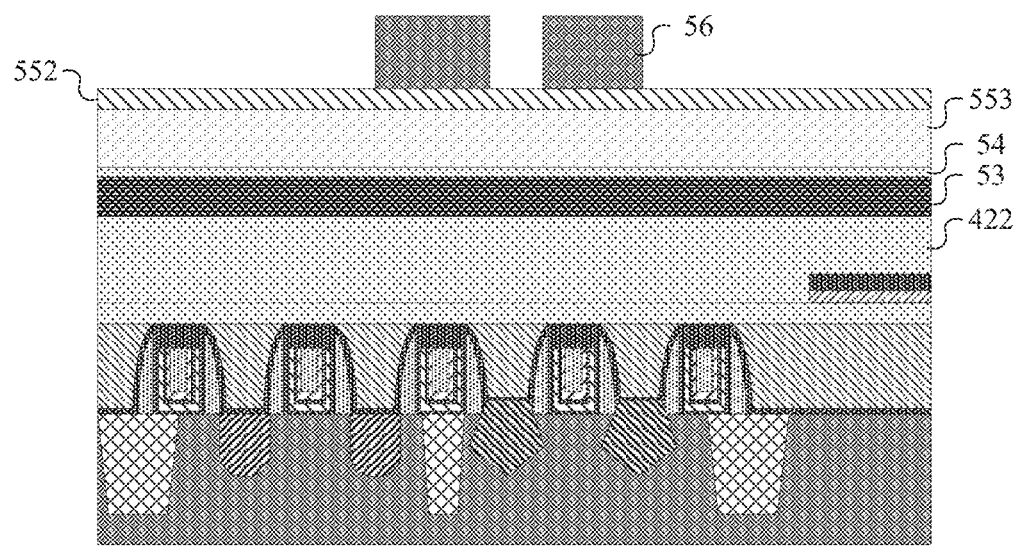
Figure 5C:
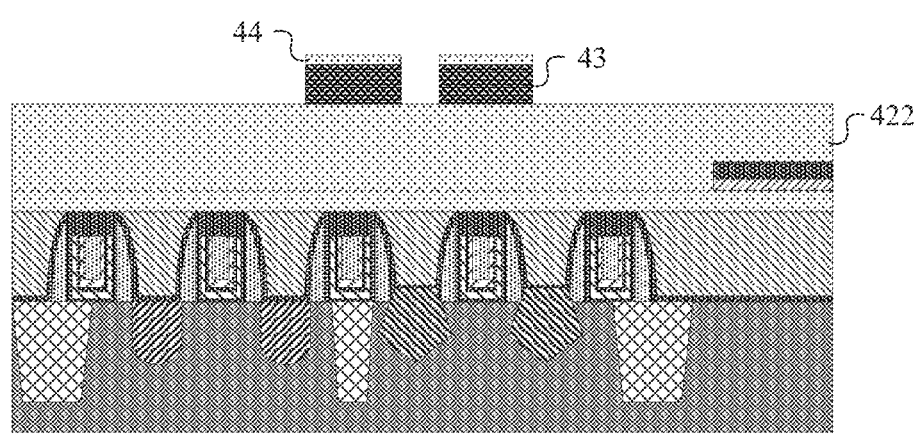

Please refer to FIGS. 5A-5C in conjunction. FIG. 5A shows a schematic structural diagram of a device to be generated according to some embodiments of the present disclosure. FIG. 5B shows a schematic structural diagram of a device to be generated after photoetching according to some embodiments of the present disclosure. FIG. 5C shows a schematic structural diagram of a device to be generated after cutting metal dielectric (CMD) etch according to some embodiments of the present disclosure.

As shown in FIG. 5A, in some embodiments of the present disclosure, when generating the metal hard mask 43 and the cap oxide 44, a metal hard mask layer 53, an oxide protective layer 54 and another set of tri-layer mask 551-553 may be deposited on the interlayer dielectric layer 422 first to form a device 50 to be generated. In some embodiments, the metal hard mask layer 53 may be a titanium nitride (TiN) layer with a height of 200 Å. In some embodiments, the oxide protective layer 54 may be an oxide layer with a height of 50-100 Å, and its material comprises but is not limited to polyethylene oxide (PEOX).

In some embodiments, the another set of tri-layer mask 551-553 may comprise a photoresist layer 551, an intermediate layer 552 and a lower layer 553. In some embodiments, the photoresist layer 551 may comprise a pattern area for defining a critical dimension of the metal hard mask 43 in the Y direction. In some embodiments, the intermediate layer 552 may be a spin on glass (SOG) layer. The lower layer 553 may be a spin on carbon (SOC) layer. By selecting intermediate layer 552 and lower layer 553 of different materials, the degree and rate of etch can be better controlled, achieving more accurate process control.

As shown in FIG. 5B, in some embodiments, the photoresist layer 551 may be developed to remove photoresist in the non-patterned area, only remaining photoresist 56 in the pattern area. Pattern of the photoresist 56 may define the critical dimension of the metal hard mask 43 in the Y direction.

As shown in FIG. 5C, in some embodiments, after photoetching, the device to be generated may be subject to a cutting metal dielectric (CMD) etch to remove the non-patterned area (that is, area not covered by the photoresist 56) in the metal hard mask layer 53 and the oxide protective layer 54, transferring the pattern of the photoresist 56 to the metal hard mask layer 53 to obtain the metal hard mask 43 and the cap oxide 44 comprising the pattern area. The pattern area of the metal hard mask layer 53 may define the critical dimension of the vertical contact M0A in the Y direction. In some embodiments, the remaining parts of the tri-layer mask 551-553 may be further removed to obtain the device to be generated after CMD etch as shown in FIG. 5C.

In some embodiments of the present disclosure, a set of tri-layer mask 451~453 may be redeposited on the device to be generated after CMD etch to form the device to be etched 40 as shown in FIG. 4.

As shown in FIG. 3, the manufacturing method of the contact of the FinFET provided by the present disclosure may further comprise the step:

302: photoetching the tri-layer mask 451~453 to remove photoresist in a non-patterned area.

In some embodiments, the tri-layer mask 451~453 may comprise a photoresist layer 451, an intermediate layer 452 and a lower layer 453. In some embodiments, the photoresist layer 451 may comprise a pattern area for defining the critical dimension of the vertical contact M0A in the X direction.

Figure 6A:
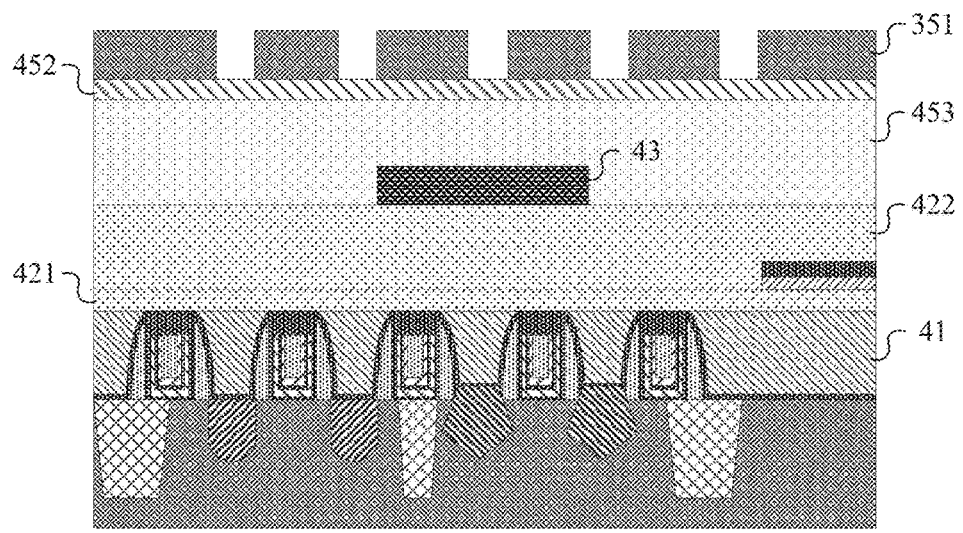
FIG. 6A shows a schematic cross-sectional view of a device to be etched in the X direction after photoetching according to some embodiments of the present disclosure.
Figure 6B:
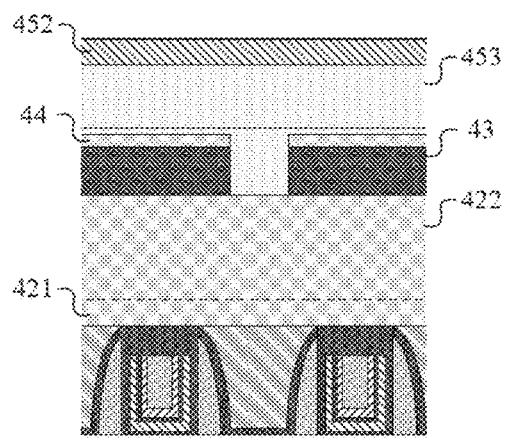
FIG. 6B shows a schematic cross-sectional view of a device to be etched in the Y direction after photoetching according to some embodiments of the present disclosure.

Referring to FIG. 6A and FIG. 6B in conjunction, FIG. 6A shows a schematic cross-sectional view of a device to be etched in the X direction after photoetching according to some embodiments of the present disclosure, and FIG. 6B shows a schematic cross-sectional view of a device to be etched in the Y direction after photoetching according to some embodiments of the present disclosure.

As shown in FIG. 6A, in some embodiments of the present disclosure, the photoresist layer 451 comprises a pattern area for defining the critical dimension of the vertical contact M0A in the X direction. After photoetching, the non-patterned area of the photoresist layer 451 will be developed and removed, exposing the underlying intermediate layer 452, the lower layer 453, the interlayer dielectric layers 421~422 and the gate layer 41. It is understandable that the metal hard mask 43 and the cap oxide 44 comprise a pattern area that defines the critical dimension of the vertical contact M0A in the Y direction. Therefore, the metal hard mask 43 without the cap oxide 44 may occur in part of the schematic cross-sectional views in the X direction.

As shown in FIG. 6B, in some embodiments of the present disclosure, the photoresist layer 451 comprises a pattern area for defining the critical dimension of the vertical contact M0A in the X direction. Therefore, after photoetching, the photoresist layer 451 may be completely developed and removed in part of the schematic cross-sectional views in the Y direction, exposing the underlying intermediate layer 452, the lower layer 453, the cap oxide 44, the metal hard mask 43, the interlayer dielectric layers 421~422 and gate layer 41. In some embodiments, the cap oxide 44 may completely cover the metal hard mask 43 to avoid damage to the metal hard mask 43 in the subsequent step of organic dielectric layer (ODL) removal.

In some embodiments of the present disclosure, before performing main etch step, the exposed intermediate layer 452 and lower layer 453 may be first ODL etched to further expose the interlayer dielectric layer 422 in the area that is neither covered by the photoresist 56 nor covered by the metal hard mask 43. In some embodiments, the intermediate layer 452 may be a spin on glass (SOG) layer. The lower layer 453 may be a spin on carbon (SOC) layer. The cap oxide 44 may be silicon dioxide (SiO$_2$). The ODL etch may selectively etch the intermediate layer 452 and the lower layer 453, but not etch the cap oxide 44 made of silicon dioxide. Therefore, by selecting the intermediate layer 452, the lower layer 453 and the cap oxide 44 of suitable materials, the etching area and the etching rate of the ODL etch can be better controlled, achieving more accurate process control.

Figure 7:
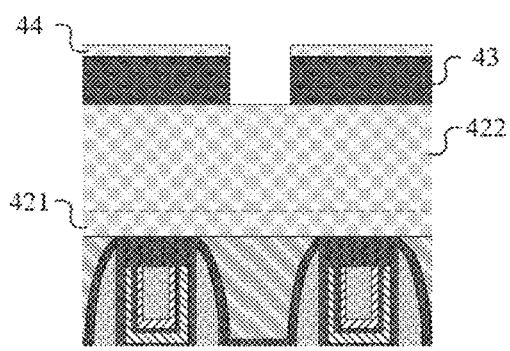
FIG. 7 shows a schematic cross-sectional view of a device to be etched in the Y direction after ODL etch according to some embodiments of the present disclosure.

Referring to FIG. 7, FIG. 7 shows a schematic cross-sectional view of a device to be etched in the Y direction after ODL etch according to some embodiments of the present disclosure.

As shown in FIG. 7, since ODL etch cannot etch the cap oxide 44 in the Y direction, the cap oxide 44 can provide effective protection to the metal hard mask 43 below. Therefore, the ODL etch may not cause titanium nitride (TiN) consumption to the metal hard mask 43 in the Y direction. The metal hard mask 43 may not be rounded.

As shown in FIG. 3, the manufacturing method of the contact of the FinFET provided by the present disclosure may further comprise the step:

303: performing main etch on the device to be etched after photoetching to remove the interlayer dielectric layers 421~422 in the area not covered by the metal hard mask 43.

In some embodiments of the present disclosure, the main etch may selectively etch the exposed interlayer dielectric layers 421~422 and filling oxide of the gate layer 41 to expose the active area under the gate layer 41. The vertical contact M0A may contact the active area from the groove opened by the main etch, leading out the active area and the polysilicon in vertical direction.

Figure 8A:
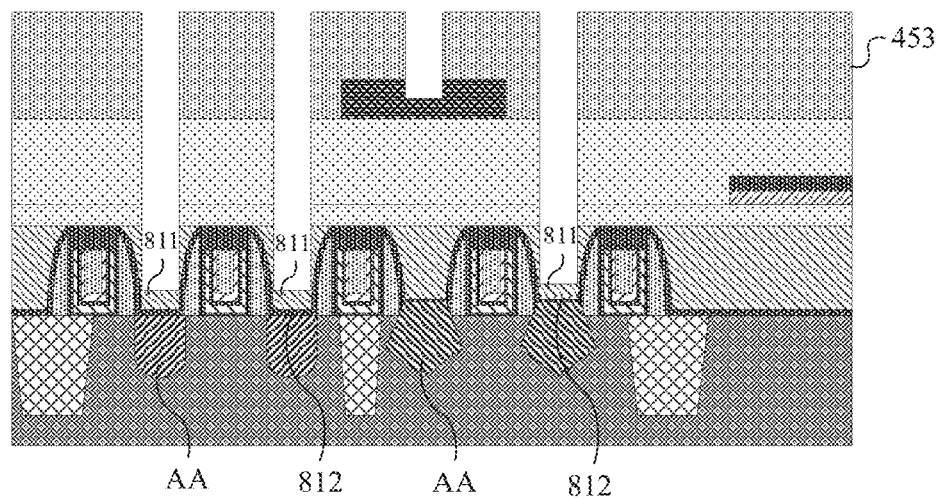
FIG. 8A shows a schematic cross-sectional view of a device to be etched in the X direction after main etch according to some embodiments of the present disclosure.
Figure 8B:
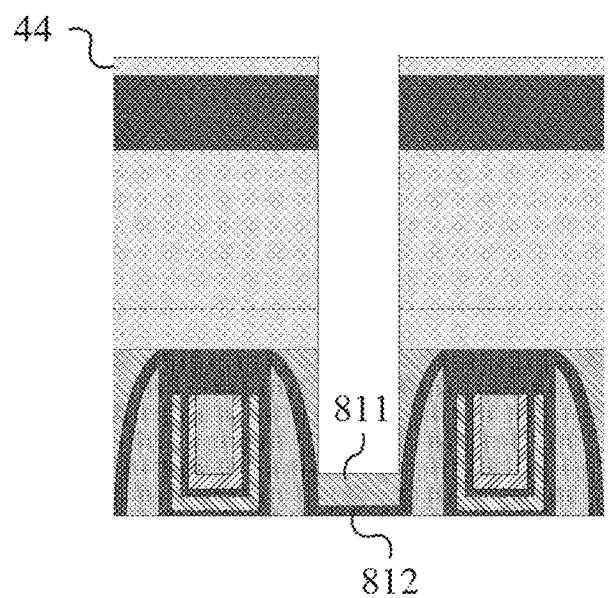
FIG. 8B shows a schematic cross-sectional view of a device to be etched in the Y direction after main etch according to some embodiments of the present disclosure.

Referring to FIG. 8A and FIG. 8B in conjunction, FIG. 8A shows a schematic cross-sectional view of a device to be etched in the X direction after main etch according to some embodiments of the present disclosure, and FIG. 8B shows a schematic cross-sectional view of a device to be etched in the Y direction after main etch according to some embodiments of the present disclosure.

As shown in FIG. 8A and FIG. 8B, in some embodiments, when performing the main etch step to remove the interlayer dielectric layer 421~422, an appropriate height of the cap oxide 44 and partial filling oxide 811 above the active area AA may be retained. In some embodiments, when performing the main etch step to remove the interlayer dielectric layer 421~422, the height of the cap oxide 44 may be ensured between 50~100 Å, to ensure that the subsequent ODL removal step may not cause a titanium nitride (TiN) consumption to the metal hard mask 43. In some embodiments, when performing the main etch step to remove the interlayer dielectric layer 421~422, the height of the partial filling oxide 811 above the active area AA may be ensured between 50~100 Å, to ensure that the subsequent ODL removal step may not oxidize the oxide layer 812 above the active area AA.

As shown in FIG. 3, the manufacturing method of the contact of the FinFET provided by the present disclosure may further comprise the step:

304: perform ODL removal on the device to be etched after the main etch to remove the remaining part of the tri-layer mask.

In some embodiments, the remaining part of the tri-layer mask comprises but is not limited to remaining lower layer 453 in the X direction. Therefore, the remaining part 453 of the tri-layer mask may be removed by an oxidation method. Since there is still the cap oxide 44 with a height between 50-100 Å to protect the metal hard mask 43 below from oxidation, the metal hard mask 43 may not be oxidized during the ODL removal step. There may not be any rounding in the Y direction either. Correspondingly, since there is still the filling oxide 811 with a height between 50-100 Å to protect the oxide layer 812 above the active area AA from oxidation, the oxide layer 812 may not be oxidized during the ODL removal step.

As shown in FIG. 3, the manufacturing method of the contact of the FinFET provided by the present disclosure may further comprise the step:

305: performing oxide etch on the device to be etched after the ODL removal to remove the cap oxide 44.

After the step of oxidative ODL removal described above, the remaining steps for manufacturing the vertical contact M0A will no longer cause significant titanium nitride (TiN) consumption to the metal hard mask 43. Therefore, the device to be etched may be subject to an oxide etch, removing the cap oxide 44 covering the metal hard mask 43 for the subsequent step of generating the contact. In some embodiments, during the oxide etch step, the remaining part of the oxide 811 and the oxide layer 812 above the active area AA may be removed together, so that the vertical contact M0A may directly contact the active area AA to lead it out to the wire layer.

Figure 9A:
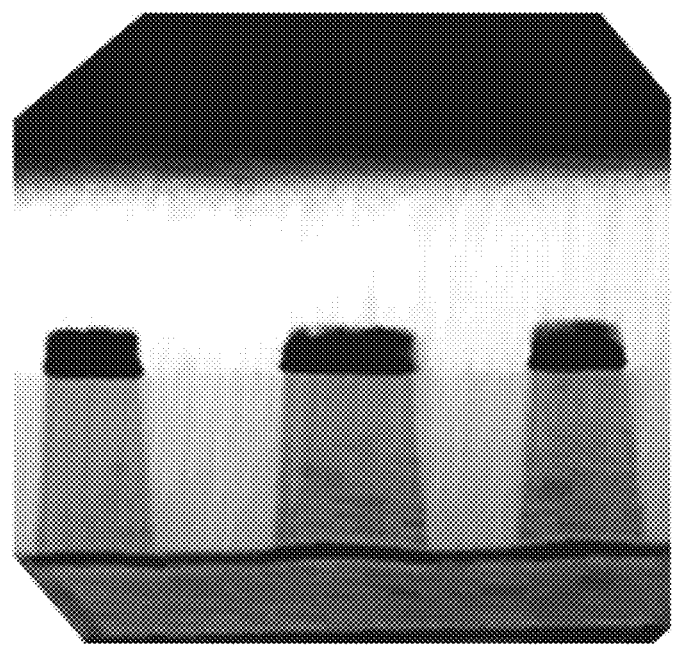
FIG. 9A shows a schematic cross-sectional view of a vertical contact M0A in the Y direction according to some embodiments of the present disclosure.
Figure 9B:
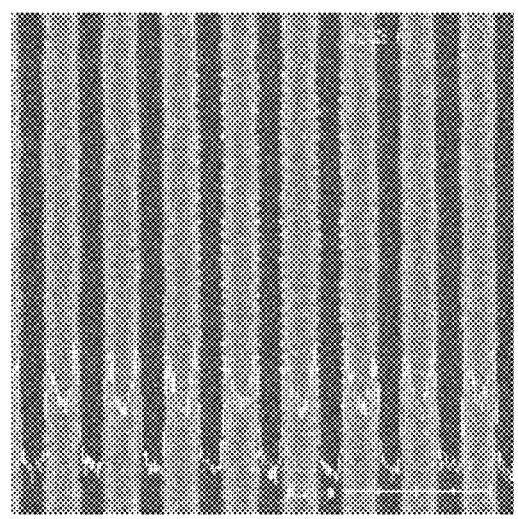
FIG. 9B shows a schematic diagram of line width roughness of the vertical contact M0A according to some embodiments of the present disclosure.

Referring to FIGS. 9A and 9B, FIG. 9A shows a schematic cross-sectional view of a vertical contact M0A in the Y direction after complete etching process according to some embodiments of the present disclosure, and FIG. 9B shows a schematic diagram of line width roughness of the vertical contact M0A after complete etching process according to some embodiments of the present disclosure.

As shown in FIG. 9A, in some embodiments of the present disclosure, the metal hard mask 43 after complete etching process is not rounded, but has an obvious non-rounded titanium nitride profile. That is to say, the manufacturing method of the above-mentioned vertical contact M0A provided by the present disclosure greatly reduces the uncontrollable result of rounding phenomenon, improving the control of the entire manufacturing process. Correspondingly, as shown in FIG. 9B, the line width roughness of the metal hard mask 43 after complete etching process is significantly reduced to 3.3, which greatly improves the performance of the vertical contact M0A.

In summary, it can be found that by generating an anti-oxidation protective cap 44 for the metal hard mask 43 before etching, the metal hard mask 43 will not be oxidized during the above-mentioned organic dielectric layer (ODL) etch step and the ODL removal step, so there is no rounding in the Y direction. Therefore, the manufacturing method of the contact of the FinFET provided by the present disclosure can accurately control the critical dimensions of the vertical contact M0A in the X direction and the Y direction, improving the performance of the vertical contact M0A, as well as improving the reliability of the manufacturing process of the FinFET.

As shown in FIG. 3, the manufacturing method of the contact of the FinFET provided by the present disclosure may further comprise the step:

306: generating a vertical contact M0A on the device after the oxide etch.

In some embodiments, a conductive material may be used to lead out the active area AA to the wire layer in vertical direction, implementing the step of generating the vertical contact M0A.

Figure 10:
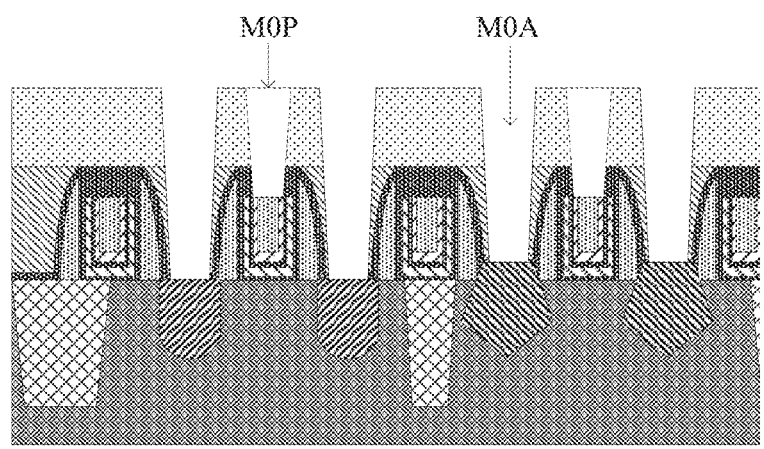
FIG. 10 shows a schematic diagram of generating a vertical contact M0A according to some embodiments of the present disclosure.

Referring to FIG. 10 shows a schematic diagram of generating a vertical contact M0A according to some embodiments of the present disclosure.

In some embodiments of the present disclosure, the vertical contact M0A may be generated in the groove opened by the above-mentioned etching step, connecting to wire M1 of the wire layer via the polysilicon 22 from the active area AA under the gate layer 41, to achieve the effect of leading out the active area 21 and the polysilicon 22 through the wire M1.

Although the method is illustrated and described as a series of actions for the purpose of simplifying the explanation, it should be understood and appreciated that these methods are not limited by the order of the actions. In some embodiments, some actions may occur in different orders and/or concurrently with other actions that are illustrated and described herein or that are not illustrated and described herein, in accordance with one or more embodiments.

In some embodiments, the method for manufacturing the vertical contact M0A can be manually implemented by the operator. In other embodiments, the method for manufacturing the vertical contact M0A can also be automatically implemented by an execution module such as a robot controlled by a processor.

According to another aspect of the present disclosure, a FinFET is also provided herein.

The FinFET provided by the present disclosure may comprise the vertical contact M0A provided in any one of the above-mentioned embodiments. As shown in FIG. 9A and FIG. 9B, the vertical contact M0A has a non-rounded TiN profile and low linear roughness, so it can have better connector performance and reliability.

In some embodiments, information, signals and data can be represented using any of a variety of different technologies and techniques. For example, the data, instructions, commands, information, signals, bits, symbols and chips cited throughout the above description can be expressed by voltage, current, electromagnetic waves, magnetic fields or magnetic particles, light fields or optical particles, or any combination of them.

In some embodiments, the various illustrative logic blocks, modules, circuits and algorithm steps described in conjunction with the embodiments disclosed herein can be implemented as electronic hardware, computer software, or a combination of the two. In order to clearly explain the interchange ability of hardware and software, various illustrative components, blocks, modules, circuits, and steps are generally described above in terms of their functionality. Whether such functionality is implemented as hardware or software depends on the specific application and the design constraints imposed on the overall system. Technicians can implement the described functionality in different ways for each specific application, but such implementation decisions should not be interpreted as causing a departure from the scope of the present disclosure.

The various illustrative logic modules and circuits described in conjunction with the embodiments disclosed herein can be general-purpose processors, digital signal processors (DSP), application-specific integrated circuits (ASIC), field programmable gate arrays (FPGA) or other programmable logic devices, discrete gate or transistor logic, discrete hardware components, or any combination thereof designed to perform the functions described herein are implemented or executed. A general-purpose processor may be a microprocessor, but in the alternative, the processor may be any conventional processor, controller, microcontroller, or state machine. The processor may also be implemented as a combination of computing devices, such as a combination of a DSP and a microprocessor, multiple microprocessors, one or more microprocessors in cooperation with a DSP core, or any other such configuration.

The steps of the method or algorithm described in conjunction with the embodiments disclosed herein may be directly embodied in hardware, in a software module executed by a processor, or in a combination of the two. The software module may reside in RAM memory, flash memory, ROM memory, EPROM memory, EEPROM memory, registers, hard disk, removable disk, CD-ROM, or any other form of storage medium known in the art. An exemplary storage medium is coupled to the processor and the processor can read information from and write information to the storage medium. In the alternative, the storage medium may be integrated into the processor. The processor and the storage medium may reside in the ASIC. The ASIC may reside in the user terminal. In the alternative, the processor and the storage medium may reside as discrete components in the user terminal.

In one or more exemplary embodiments, the functions described may be implemented in hardware, software, firmware, or any combination thereof. If implemented as a computer program product in software, each function can be stored as one or more instructions or codes on a computer-readable medium or transmitted through it. Computer-readable media includes both computer storage media and communication media, including any medium that facilitates the transfer of a computer program from one place to another. The storage medium may be any available medium that can be accessed by a computer. By way of example and not limitation, such computer-readable media may include RAM, ROM, EEPROM, CD-ROM or other optical disk storage, magnetic disk storage or other magnetic storage devices, or any other medium that can be used to carry or store desired program codes in the form of instructions or data structures and that can be accessed by a computer. Any connection is also properly called a computer-readable medium. For example, if the software is transmitted from a web site, server, or other remote source using coaxial cable, fibre optic cable, twisted pair, digital subscriber line (DSL), or wireless technology such as infrared, radio, and microwave, then the coaxial cable, fibre optic cable, twisted pair, DSL, or wireless technologies such as infrared, radio, and microwave are included in the definition of the medium. Disks and discs as used in this article include compact discs (CDs), laser discs, optical discs, digital versatile discs (DVD), floppy disks and Blu-ray discs, among which disks are often reproduced in a magnetic manner Data, and a disc optically reproduces the data with a laser. Combinations of the above should also be included in the scope of computer-readable media.

What is claimed is:

1. A manufacturing method of a contact of a FinFET, comprising:
   sequentially generating an interlayer dielectric layer, a metal hard mask, an oxide protective cap and a tri-layer mask on a gate layer to form a device to be etched, the tri-layer mask comprising a photoresist layer having a first pattern area and a first non-patterned area;
   photoetching the tri-layer mask to remove the first non-patterned area of the photoresist layer;
   performing main etch on the device to be etched after photoetching to remove the interlayer dielectric layer in an area neither covered by the photoresist nor covered by the metal hard mask, wherein the metal hard mask is provided with the oxide protective cap, the metal hard mask and the oxide protective cap forms a second pattern area;
   performing organic dielectric layer (ODL) removal on the device to be etched after the main etch to remove remaining part of the tri-layer mask;
   performing oxide etch on the device to be etched after the ODL removal to remove the oxide protective cap; and
   generating the contact on the device after the oxide etch;
   wherein the gate layer comprises a plurality of gates and an oxide material configured for filling one or more gaps among the plurality of gates;
   wherein each of the plurality of gates is configured to be connected to an active area;
   wherein the contact of the FinFET is characterized by a first critical dimension along a first direction and a second critical dimension along a second direction, the first pattern area is configured to define the first critical dimension of the contact, and the second pattern area is configured to define the second critical dimension of the contact.

2. The manufacturing method of claim 1, wherein the tri-layer mask further comprises an intermediate layer and a lower layer.

3. The manufacturing method of claim 1, wherein
   the oxide protective cap covers the metal hard mask to avoid damage to the metal hard mask in the ODL removal step.

4. The manufacturing method of claim 3, wherein the step of generating the metal hard mask and the oxide protective cap comprises:
   depositing a metal hard mask layer, an oxide protective layer and another set of tri-layer mask on the interlayer dielectric layer to form a device to be generated;
   photoetching the another set of tri-layer mask, removing photoresist in non-patterned area to define a critical dimension of the metal hard mask in a Y direction, the critical dimension of the metal hard mask in the Y direction being associated with the second critical dimension of the contact; and
   performing CMD etch on the device to be generated after photoetching to obtain the metal hard mask and the oxide protective cap comprising the pattern area.

5. The manufacturing method of claim 1, wherein the main etch step further comprises:
   retaining the oxide protective cap and a part of the oxide material of the gate layer positioned on the active area when removing the interlayer dielectric layer.

6. The manufacturing method of claim 5, wherein the step of retaining the oxide protective cap and part of the oxide layer above the active area further comprises:
   ensuring that a height of the oxide protective cap is between 50 angstroms and 100 angstroms; and
   ensuring that a height of the part of the oxide layer is between 50 angstroms and 100 angstroms.

7. The manufacturing method of claim 5, wherein the oxide etch step further comprises:
   removing the part of the oxide layer retained above the active area.

8. The manufacturing method of claim 1, wherein the step of generating the contact comprises:
   leading out an active area to wire layer in vertical direction with a conductive material.

9. A FinFET, comprising:
   a contact manufactured by the manufacturing method of claim 1.

10. A manufacturing method of a contact of a FinFET, comprising:
    sequentially generating an interlayer dielectric layer, a metal hard mask, an oxide protective cap and a tri-layer mask on a gate layer to form a device to be etched, the tri-layer mask comprising a photoresist layer having a first pattern area and a first non-patterned area, the interlayer dielectric layer being directly positioned on the gate layer, and the metal hard mask being directly positioned on the interlayer dielectric layer;
    photoetching the tri-layer mask to remove the first non-patterned area of the photoresist layer;
    performing main etch on the device to be etched after photoetching to remove the interlayer dielectric layer in an area neither covered by the photoresist nor covered by the metal hard mask, wherein the metal hard mask is provided with the oxide protective cap, the metal hard mask and the oxide protective cap forms a second pattern area;
    performing organic dielectric layer (ODL) removal on the device to be etched after the main etch to remove remaining part of the tri-layer mask;
    performing oxide etch on the device to be etched after the ODL removal to remove the oxide protective cap; and
    generating the contact on the device after the oxide etch;
    wherein the contact of the FinFET is characterized by a first critical dimension along a first direction and a second critical dimension along a second direction, the first pattern area is configured to define the first critical dimension of the contact, and the second pattern area is configured to define the second critical dimension of the contact.

11. The manufacturing method of claim 10, wherein the tri-layer mask further comprises an intermediate layer and a lower layer.

12. The manufacturing method of claim 11, wherein the intermediate layer of the tri-layer mask comprises a spin on glass (SOG) layer.

13. The manufacturing method of claim 11, wherein the lower layer of the tri-layer mask comprises a spin on carbon (SOC) layer.

14. The manufacturing method of claim 10, wherein during the organic dielectric layer removal, a part of the metal hard mask in the second direction remains unetched due to a protection of the oxide protective cap.

* * * * *